United States Patent
Rossman et al.

(10) Patent No.: US 10,193,281 B1
(45) Date of Patent: Jan. 29, 2019

(54) ELECTRICAL CONNECTOR ASSEMBLY HAVING A SHIELD ASSEMBLY

(71) Applicant: TE CONNECTIVITY CORPORATION, Berwyn, PA (US)

(72) Inventors: Jared Evan Rossman, Dover, PA (US); Richard Elof Hamner, Hummelstown, PA (US)

(73) Assignee: TE CONNECTIVITY CORPORATION, Berwyn, PA (US)

(*) Notice: Subject to any disclaimer, the term of this patent is extended or adjusted under 35 U.S.C. 154(b) by 0 days.

(21) Appl. No.: 15/726,567

(22) Filed: Oct. 6, 2017

(51) Int. Cl.
| | |
|---|---|
| *H01R 13/658* | (2011.01) |
| *H01R 13/6584* | (2011.01) |
| *H01R 13/6596* | (2011.01) |
| *H05K 9/00* | (2006.01) |
| *H01R 9/03* | (2006.01) |
| *H01R 13/6599* | (2011.01) |
| *H01R 13/6592* | (2011.01) |
| *H01R 13/633* | (2006.01) |

(52) U.S. Cl.
CPC ... *H01R 13/65802* (2013.01); *H01R 13/6584* (2013.01); *H01R 13/6596* (2013.01); *H05K 9/0018* (2013.01); *H01R 9/034* (2013.01); *H01R 13/6335* (2013.01); *H01R 13/6592* (2013.01); *H01R 13/6599* (2013.01)

(58) Field of Classification Search
CPC .............. H01R 13/6592; H01R 9/032; H01R 13/5213; H01R 13/6275; H01R 13/639; H01R 13/6463; H01R 13/659; H01R 9/0524; H01R 13/5808; H01R 13/5812; H01R 13/648; H01R 13/6581; H01R 13/6593; H01R 13/719
See application file for complete search history.

(56) References Cited

U.S. PATENT DOCUMENTS

| | | | | |
|---|---|---|---|---|
| 4,671,598 | A | * 6/1987 | Keehne | H01R 13/658 439/607.47 |
| 4,808,128 | A | * 2/1989 | Werth | H01R 13/6592 439/607.5 |
| 5,726,389 | A | 3/1998 | Hogeveen et al. | |
| 5,895,292 | A | * 4/1999 | Affeltranger | H01R 13/518 439/607.56 |
| 6,482,017 | B1 | * 11/2002 | Van Doorn | H01R 13/5213 439/149 |
| 7,413,473 | B2 | 8/2008 | Wu | |
| 7,789,703 | B2 | 9/2010 | Mulfinger et al. | |

(Continued)

*Primary Examiner* — Truc Nguyen

(57) ABSTRACT

A connector assembly for terminating a cable having a cable shield is provided including an electrically conductive backshell and a shield assembly. The backshell includes a body that extends from a mating end to a cable end along a mating axis. The cable end includes a cable channel that extends through the body and holds an end segment of the cable therein. The connector assembly includes a shield assembly having a clamp system that is held within the cable end of the backshell and includes front and rear clamping members. The cable shield is terminated to the clamp system between the front and the rear clamping members. The connector assembly includes an EMI gasket that is electrically coupled to the backshell and held within the cable end of the backshell. The EMI gasket includes a backshell interface that engages the backshell and a clamp interface that engages the clamp system.

20 Claims, 5 Drawing Sheets

(56) References Cited

U.S. PATENT DOCUMENTS

| | | |
|---|---|---|
| 9,270,059 B2 | 2/2016 | Dunwoody et al. |
| 2005/0133245 A1* | 6/2005 | Katsuyama ............ H01R 9/031 |
| | | 174/74 R |
| 2005/0164543 A1* | 7/2005 | Dang ................ H01R 13/5841 |
| | | 439/468 |
| 2012/0325513 A1* | 12/2012 | Bungo ................ H01R 9/0521 |
| | | 174/89 |
| 2014/0030921 A1* | 1/2014 | Kobayashi ......... H01R 13/6591 |
| | | 439/607.01 |
| 2014/0199887 A1* | 7/2014 | Germ .................... H01R 9/032 |
| | | 439/607.41 |

* cited by examiner

ELECTRICAL CONNECTOR ASSEMBLY HAVING A SHIELD ASSEMBLY

BACKGROUND OF THE INVENTION

The subject matter herein relates generally to an electrical connector for terminating an electrical cable having a cable shield.

Electrical connectors that terminate electrical cables may include a housing that provides shielding for one or more electrical contacts held by the housing. For example, the housing may include an electrically conductive coating (e.g., plating), an electrically conductive shell, and/or another electrically conductive structure that extends around the electrical contacts for shielding the electrical contacts. The shield of the housing is terminated to a shield (e.g., a cable braid) of the cable that provides shielding for one or more electrical wires of the cable. The shielding provided by the housing and the cable shield may reduce electromagnetic interference (EMI) emissions to and from the cable assembly of the electrical cable and the electrical connector assembly. EMI emitted from the cable assembly may harm the signal integrity and/or electrical performance of neighboring electrical devices, for example. Moreover, government regulations may require that EMI emissions from the cable assembly be contained to a predetermined level.

The EMI shielding of at least some known cable assemblies may be inadequate because of the increasing signal speeds being transmitted through cable assemblies. For example, the connection between the housing shield and the cable shield may leak EMI above certain signals speeds, such as above approximately 10 gigahertz (GHz). Some known cable assemblies wherein the cable shield is a cable braid that is dressed over a ferrule of the housing may be especially susceptible to EMI leakage at the interface between the cable braid and the ferrule because of the flare of the cable braid over the ferrule.

Accordingly, there is a need for an electrical connector assembly that reduces EMI emissions.

BRIEF DESCRIPTION OF THE INVENTION

In one embodiment, a connector assembly for terminating a cable having a cable shield that is electrically conductive is provided including a backshell and a shield assembly. The backshell is electrically conductive and includes a body that extends from a mating end to a cable end along a mating axis of the connector assembly. The backshell provides shielding for an electrical connector that is received in the backshell at the mating end. The cable end includes a cable channel that extends through the body and holds an end segment of the cable therein. The connector assembly includes a shield assembly that includes a clamp system. The clamp system is electrically conductive and held within the cable end of the body of the backshell. The clamp system includes a front clamping member and a rear clamping member. The cable shield of the cable is terminated to the clamp system between the front clamping member and the rear clamping member. The connector assembly includes an electromagnetic interference (EMI) gasket. The EMI gasket is electrically coupled to the backshell and held within the cable end of the body of the backshell. The EMI gasket includes a backshell interface and a clamp interface, wherein the backshell interface engages the backshell and the clamp interface engages the clamp system.

In another embodiment, a shield assembly is provided including a clamp system and an electromagnetic interference (EMI) gasket. The clamp system is held within a cable end of a backshell of a connector assembly. The backshell is electrically conductive and includes a body that extends between the cable end and a mating end along a mating axis of the connector assembly. The connector assembly terminates a cable having a cable shield that is electrically conductive. The clamp system includes a front clamping member and a rear clamping member. The cable shield of the cable terminates to the clamp system between the front clamping member and the rear clamping member. The EMI gasket is electrically coupled to the backshell and held within the cable end of the body of the backshell. The EMI gasket includes a backshell interface and a clamp interface, wherein the backshell interface engages the backshell and the clamp interface engages the clamp system.

In a further embodiment, a connector assembly for terminating a cable having a cable shield that is electrically conductive is provided that includes an electrical connector, a backshell, and a shield assembly. The electrical connector includes a dielectric housing holding a plurality of contacts. The dielectric housing includes a mating end that mates to a mating connector along a mating axis and a cable end that receives one or more conductors of the cable therein. The backshell includes a body that extends from a mating end to a cable end along the mating axis. The dielectric housing of the electrical connector is disposed at the mating end of the body. The cable end includes a cable channel that extends through the body and holds an end segment of the cable therein. The connector assembly includes a shield assembly that includes a clamp system. The clamp system is electrically conductive and held within the cable end of the body of the backshell. The clamp system includes a front clamping member and a rear clamping member. The cable shield of the cable terminates to the clamp system between the front clamping member and the rear clamping member. The connector assembly also includes an electromagnetic interference (EMI) gasket. The EMI gasket is electrically coupled to the backshell and held within the cable end of the body of the backshell. The EMI gasket includes a backshell interface and a clamp interface, wherein the backshell interface engages the backshell and the clamp interface engages the clamp system.

DETAILED DESCRIPTION OF THE INVENTION

Figure 1:
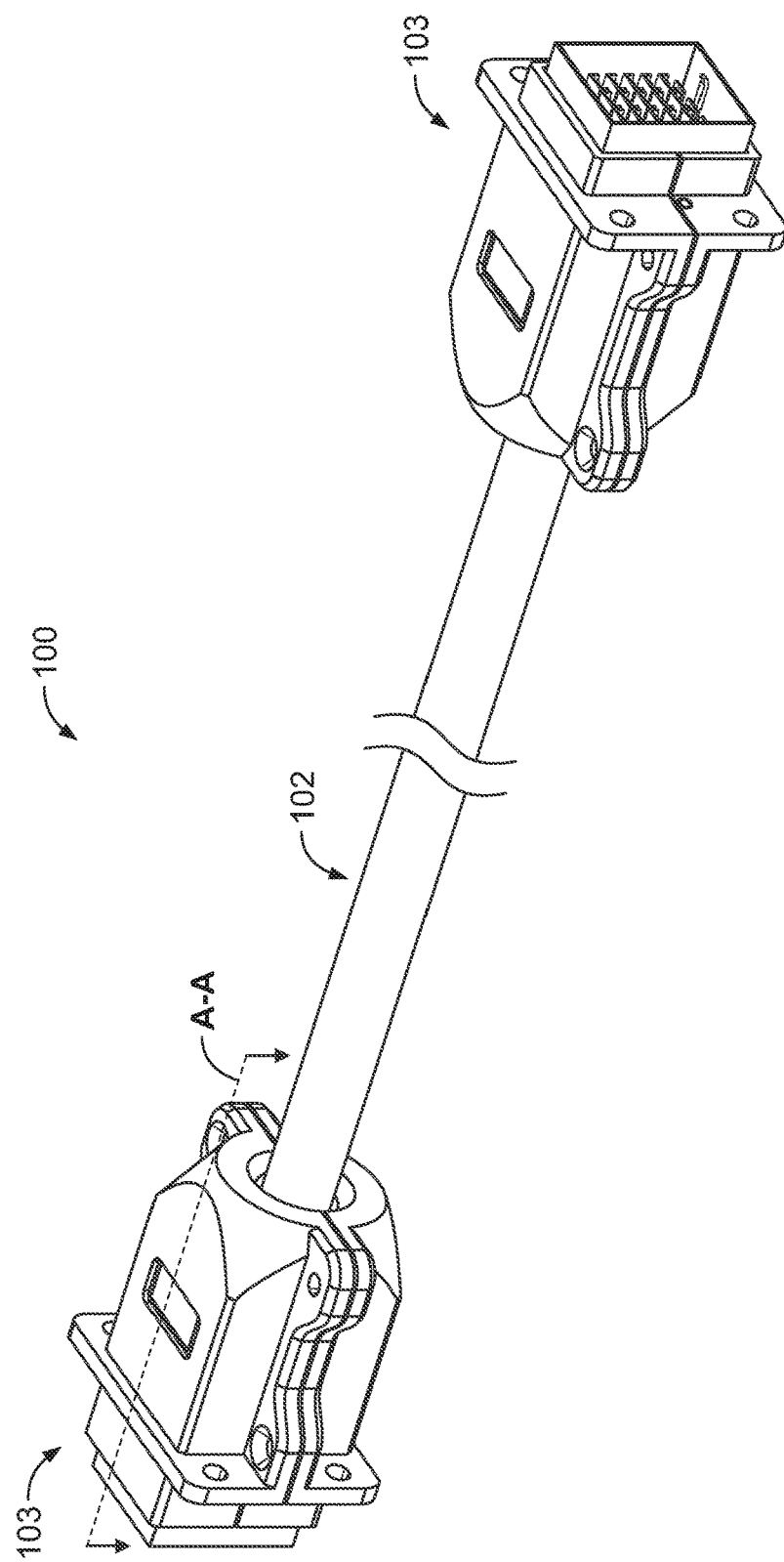
FIG. 1 is a perspective view of a cable assembly formed in accordance with an embodiment.

FIG. 1 is a perspective view of a cable assembly 100 in accordance with one embodiment. The cable assembly 100 includes a cable 102 and connector assemblies 103 that are disposed on each end of the cable 102 and that terminate to the cable 102. In the illustrated embodiment, the connector assemblies 103 are radio frequency (RF) connectors, however, the connector assemblies 103 may be any other type of connector assembly, such as differential pair wire connectors, or the like. Optionally, one or more of the connector assemblies 103 may be high speed, differential pair connectors. In one or more embodiments, one or more of the connector assemblies 103 may be configured to transmit high-speed data signals, such as, but not limited to, data signals greater than approximately 5 gigabits per second (Gb/s), data signals greater than approximately 10 Gb/s, data signals greater than approximately 15 Gb/S, data signals greater than approximately 20 Gb/S, or the like.

The cable assembly 100 may be used for any application and may be optionally adapted for use in military applications, aerospace applications, automotive applications, industrial applications, commercial applications, communication equipment (e.g., computer servers, internet routers, and/or the like), or the like. Non-limiting examples of such applications include host bus adapters (HBAs), redundant arrays of inexpensive disks (RAIDs), workstations, storage racks, high performance computers, or switches. The cable assembly 100 may be configured to be compliant with industry standards, such as, but not limited to, the small-form factor pluggable (SFP) standard, enhanced SFP (SFP+) standard, quad SFP (QSFP) standard, C form-factor pluggable (CFP) standard, 10 Gigabit SFP standard, which is often referred to as the XFP standard, or the like. Optionally, the cable assembly 100 may include a single connector assembly 103 disposed at one end of the cable 102, and an alternative connector assembly, mating connector, or the like, disposed at the other end of the cable 102.

Figure 2:
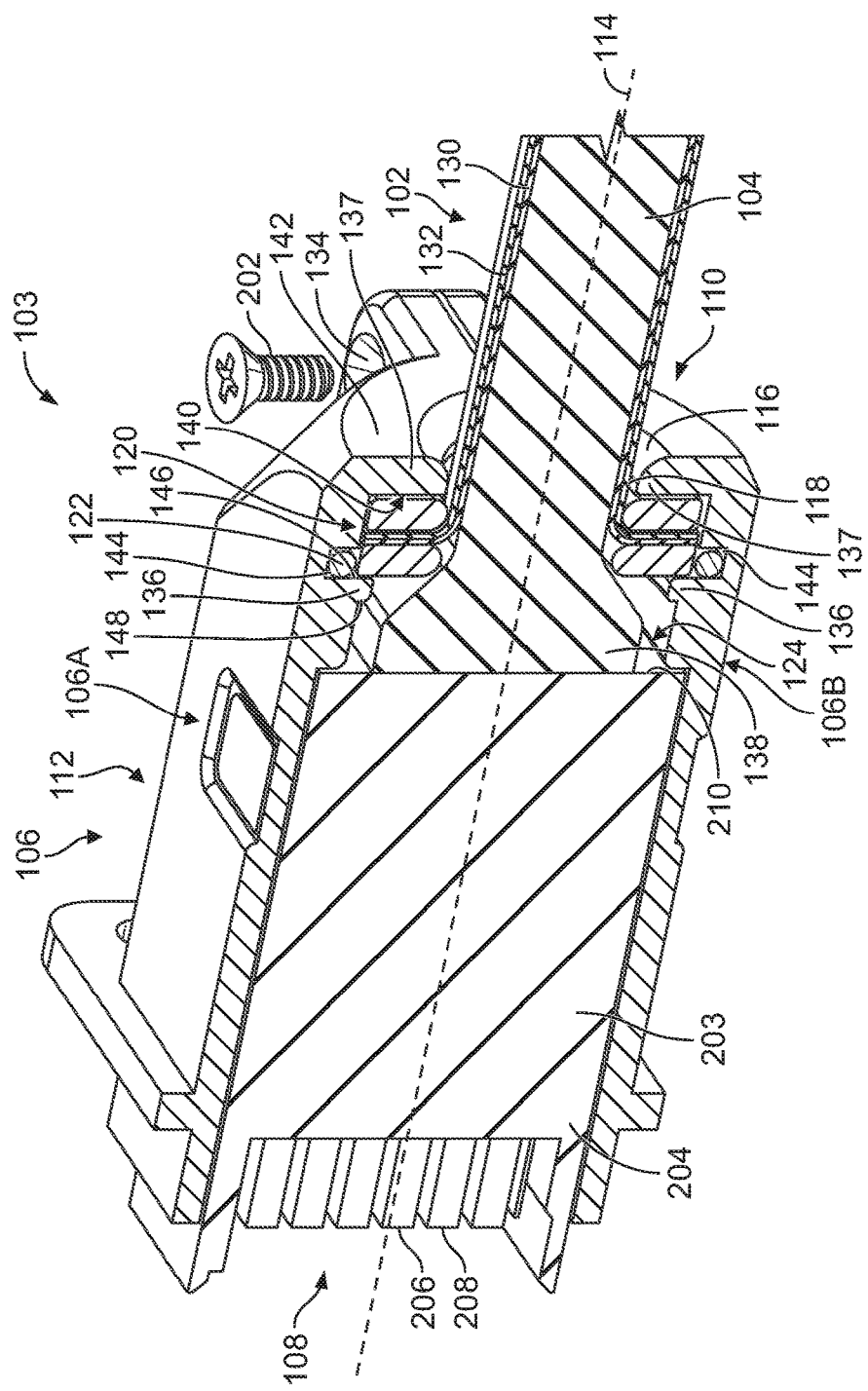
FIG. 2 is a perspective cross-sectional view of a connector assembly in accordance with an embodiment.

FIG. 2 is a perspective cross-sectional view of the connector assembly 103 in accordance with one embodiment. The connector assembly 103 includes a backshell 106 having a body 112 that extends from a mating end 108 to a cable end 110 along a mating axis 114. The connector assembly 103 is configured to mate with a mating connector (not shown) at the mating end 108 of the body 112. The connector assembly 103 is configured to terminate an end segment 118 of the cable 102 at the cable end 110 of the body 112.

In the illustrated embodiment, the backshell 106 includes discrete sub-shells 106A, 106B that are connected together to define the backshell 106. For example, in the illustrated embodiment, the connector assembly 103 includes two sub-shells 106A, 106B that are substantially identical and are held together by one or more fasteners 202. The sub-shell 106A may be referred to as an upper shell 106A and the sub-shell 106B may be referred to as a lower shell 106B. The upper shell 106A may be inverted and substantially identical and/or hermaphroditic to the lower shell 106B. For example, the discrete sub-shells 106A, 106B may be fabricated using the same mold. Optionally, the upper shell 106A or the lower shell 106B may have a unique shape. In one or more embodiments, the connector assembly 103 may include any number of sub-shells 106 that connect together to define the backshell 106. Alternatively, the backshell 106 may be defined by a single shell, such as, but not limited to, a single rigid shell, a single shell having two or more integrally-formed sub-shells that are connected together at a hinge, or the like.

The upper and lower sub-shells 106A, 106B define a portion of a cavity 124 of the body 112 of the backshell 106. For example, the sub-shells 106A, 106B define a cavity 124 configured to receive or house at least a mating connector (not shown) at the mating end 108, a dielectric housing 204 of an electrical connector 203, a end segment 118 of the cable 102 at the cable end 110, or the like. Optionally, the cavity 124 of the body 112 of the upper and lower shells 106A, 106B may be shaped and sized in order to receive any additional or alternative components, such as, but not limited to, cables, wires, electrical contacts, or the like.

The upper shell 106A and the lower shell 106B are connected together using the threaded fastener 202. The threaded fastener 202 extends through openings 134 of the sub-shells 106A, 106B and threadably engage threaded holes of the sub-shells 106A, 106B to secure the upper and lower shells 106A, 106B together. Additionally or alternatively to threaded fasteners 202, openings 134 and threaded holes, any other structure, method, means, connection type, or the like may be used to connect the sub-shells 106A, 106B together, such as, but not limited to, using a snap-fit connection, using a latch, or the like. For example, the sub-shells 106A, 106B may be held together with a hinge along one side of the sub-shells 106A, 106B and may be secured together using a snap, latch, or the like. Moreover, one or more of the threaded fasteners 202 may threadably engage a nut (not shown) instead of, or in addition to, engaging a threaded hole.

The cable end 110 of the body 112 includes a cable channel 116 that extends through the body 112 of the backshell 106. For example, the cable channel 116 may be a passage that extends between the cable end 110 of the body 112 and the cavity 124 when the upper and lower shells 106A, 106B are connected. The cable channel 116 is configured to hold the end segment 118 of the cable 102 therein such that the sub-shells 106A, 106B support the end segment 118 of the cable 102.

The backshell 106 includes a forward flange 136 and a rear flange 137 at the cable end 110 of the body 112 along the mating axis 114. The forward flange 136 includes an inner surface 146 that faces the cable end 110 of the body 112 (e.g., faces rearward of the sub-shells 106A, 106B) and an outer surface 148 that faces the mating end 108 of the body 112. The rear flange 137 includes an inner surface 140 that is open to and faces the cavity 124 of the sub-shells 106A, 106B and an outer surface 142 that faces rearward of the sub-shells 106A, 106B. In the illustrated embodiment, the rear flange 137 includes an outer profile having a generally circular shape. For example, the circular shape of the rear flange 137 of the upper and lower shells 106A, 106B is shaped and sized in order to receive the end segment 118 of the generally circular cable 102. The outer profile of the rear flange 137 extends into the cable channel 116. Additionally or alternatively, one or more of the sub-shells 106A, 106B may have one or more flanges that have unique shapes and/or sizes, one or more of the sub-shells 106A, 106B may be devoid a flange, or any combination therein.

The body 112 of the backshell 106 may be fabricated from any material(s) having any material properties that enable the backshell 106 to function as described and/or illustrated herein, such as, but not limited to, a metal or metallic alloy, a plastic, a polymer, a composite material, an elastomer, a thermoplastic, a thermoset, a natural material, and/or the like. The backshell 106 may be provided with a rigidity and/or hardness that facilitates latching to the mating connector (not shown) and/or that facilitates sealing with the mating connector. For example, the body 112 of the backshell 106 may be diecast, machined, or the like.

The cable 102 includes one or more conductors 104 (e.g., electrical wires) and a cable shield 130 that extends around the conductors 104. Optionally, the conductors 104 may be arranged as twisted wire pairs that carry differential signals. Additionally or alternatively, the conductors 104 may be arranged in pairs that carry differential signals and each pair is shielded by a cable shield 130 or the like. Optionally, each conductor 104 may include an individual electrical insulation layer that extends around the conductor 104. Additionally or alternatively, the cable 102 may include an electrical insulation layer (not shown) that is disposed between the conductors 104 and the cable shield 130 of the cable 102. For example, in some embodiments, the cable 102 is a coaxial cable having a single central electrical conductor that is separated and electrically isolated from the cable shield 130 via an electrical insulation layer that extends coaxially between the single electrical conductor and the cable shield 130.

The cable shield 130 is electrically conductive to provide electrical shielding for the conductors 104. The cable shield 130 may define an electrical ground and/or shield pathway through the cable 102. The cable shield 130 may have any structure such as, but not limited to, a braid, a shield, metallic armor, and/or the like. The cable shield 130 provides electrical shielding for the conductors 104 of the cable 102 from external sources of EMI/RFI interference. Optionally, the cable shield 130 may provide flexibility for the cable 102, allowing the cable 102 to bend and flex while maintain shielding integrity. Other types of cable shields may be provided in alternative embodiments, such as, but not limited to, conductive foils or conductive fabrics wrapped helically around the conductors 104 of the cable 102, or the like. Additionally, the cable shield 130 may provide shielding from other types of interference as well to better control electrical characteristics, such as, impedance, cross-talk, and the like, of the conductors 104 of the cable 102. The cable 102 optionally includes a protective jacket 132 that extends around at least a portion of the cable shield 130. For example, the protective jacket 132 may be manufactured of a metallic alloy or metalized fibers and may electrically insulate the conductors 104 and the cable shield 130. Additionally or alternatively, the protective jacket 132 may be manufactured of a non-metalized material and may provide abrasion resistance to the cable 102, or the like.

The connector assembly 103 includes an electromagnetic interference (EMI) gasket 122. The EMI gasket 122 provides electrical shielding to the connector assembly 103, which may prevent or reduce electromagnetic interference and/or radio frequency interference (RFI) on signal paths defined through the connector assembly 103. Electrical shielding provided by the EMI gasket 122 may allow relatively high speed data to be uninterrupted by surrounding sources of interference. Additionally, the EMI gasket 122 may provide shielding from other types of interference as well to better control electrical characteristics, such as, impedance, cross-talk, and the like, of the conductors 104 of the cable 102. Optionally, the EMI gasket 122 may be electrically connected to a ground conductor of the cable 102 (not shown), may be electrically connected to a ground conductor of the connector assembly (not shown), or the like.

The EMI gasket 122 is a conductive elastomeric gasket. For example, made of a mixture of an elastomeric material and conductive particles, such as silver or other metallic particles or conductive nanoparticles, the EMI gasket 122 is internally conductive. Optionally, the EMI gasket 122 may be manufactured of a conductive non-elastomeric material, such as, but not limited to, a metallic alloy, a conductive plastic, a conductive polymer, a conductive composite material, a conductive thermoplastic, a conductive thermoset, or the like.

The EMI gasket 122 is held within the backshell 106 and disposed proximate to the cable channel 116 along the mating axis 114. In the illustrated embodiment, the EMI gasket 122 is held within a gasket channel 144 of the backshell 106 that extends circumferentially or peripherally around the cable end 110 of the body 112 about the mating axis 114. For example, the inner surface 146 of the forward flange 136 is formed by the gasket channel 144. Additionally, the EMI gasket 122 extends circumferentially or peripherally around the cable 102 about the mating axis 114 of the connector assembly 103. Additionally, the EMI gasket 122 extends along the periphery (not shown) of the sub-shells 106A, 106B from the cable end 110 to the mating end 108 in a direction along the mating axis 114. The EMI gasket 122 is electrically coupled with the body 112 of the upper and lower sub-shells 106A, 106B and is configured to absorb EMI emitted from the cable 102. In the illustrated embodiment, the EMI gasket 122 has a circular cross-sectional shape and is sized in order to substantially fill the gasket channel 144. Optionally, the EMI gasket 122 may have any alternative cross-sectional shape, may be sized in order to substantially fill a gasket channel 144 having any alternative size, may be sized in order to fill any alternative channel, slot, space, or the like, of the backshell 106, or the like. Additionally or alternatively, the EMI gasket 122 may be held within the backshell 106 by any alternative method, such as, but not limited to, by adhesive, a clip, a snap mechanism, or the like. The EMI gasket 122 will be described in more detail below.

The connector assembly 103 includes an electrical connector 203. The electrical connector 203 includes a dielectric housing 204 that is disposed within the cavity 124 of the body 112. The dielectric housing 204 extends between a mating end 208 and a cable end 210. The electrical connector 203 contains one or more electrical contacts 206 that are held within the dielectric housing 204. The electrical contacts 206 may be arranged as differential pairs that carry differential signals, or may be arranged in any alternative configuration. The electrical contacts 206 are configured to electrically terminate to one or more mating electrical contacts of a mating connector (not shown) at the mating end 208 of the dielectric housing 204. For example, each electrical contact 206 of the electrical connector 203 may terminate to one or more mating contacts of a mating connector (not shown) when a mating connector is joined to the connector assembly 103 at the mating end 108 of the body 112. Additionally, the electrical contacts 206 are configured to electrically terminate to a terminating end 138 of the conductors 104 of the cable 102 at the cable end 210 of the dielectric housing 204. The electrical connector 203 may include any number of electrical contacts 206, which may or may not be the same number as the number of conductors 104 of the cable 102.

The connector assembly 103 includes a shield assembly 120 that is disposed inside of the backshell 106 at the cable end 110 of the body 112. For example, in the illustrated embodiment, the position of the shield assembly 120 is maintained along the mating axis 114 within the cavity 124 that is defined by the upper and lower sub-shells 106A, 106B by the inner surface 146 of the forward flange 136 and by the inner surface 140 of the rear flange 137. Optionally, the shield assembly 120 may be disposed at any alternative location with respect to the forward and rear flanges 136, 137, the cavity 124 of the body 112 of the backshell 106, or the like. The shield assembly 120 is configured to electrically terminate the cable shield 130 and mechanically couple the protective jacket 132 of the cable 102 to the connector assembly 103. The shield assembly 120 includes a clamp system 302 (illustrated in FIGS. 3 and 4) that is electrically coupled with the EMI gasket 122.

Figure 3:
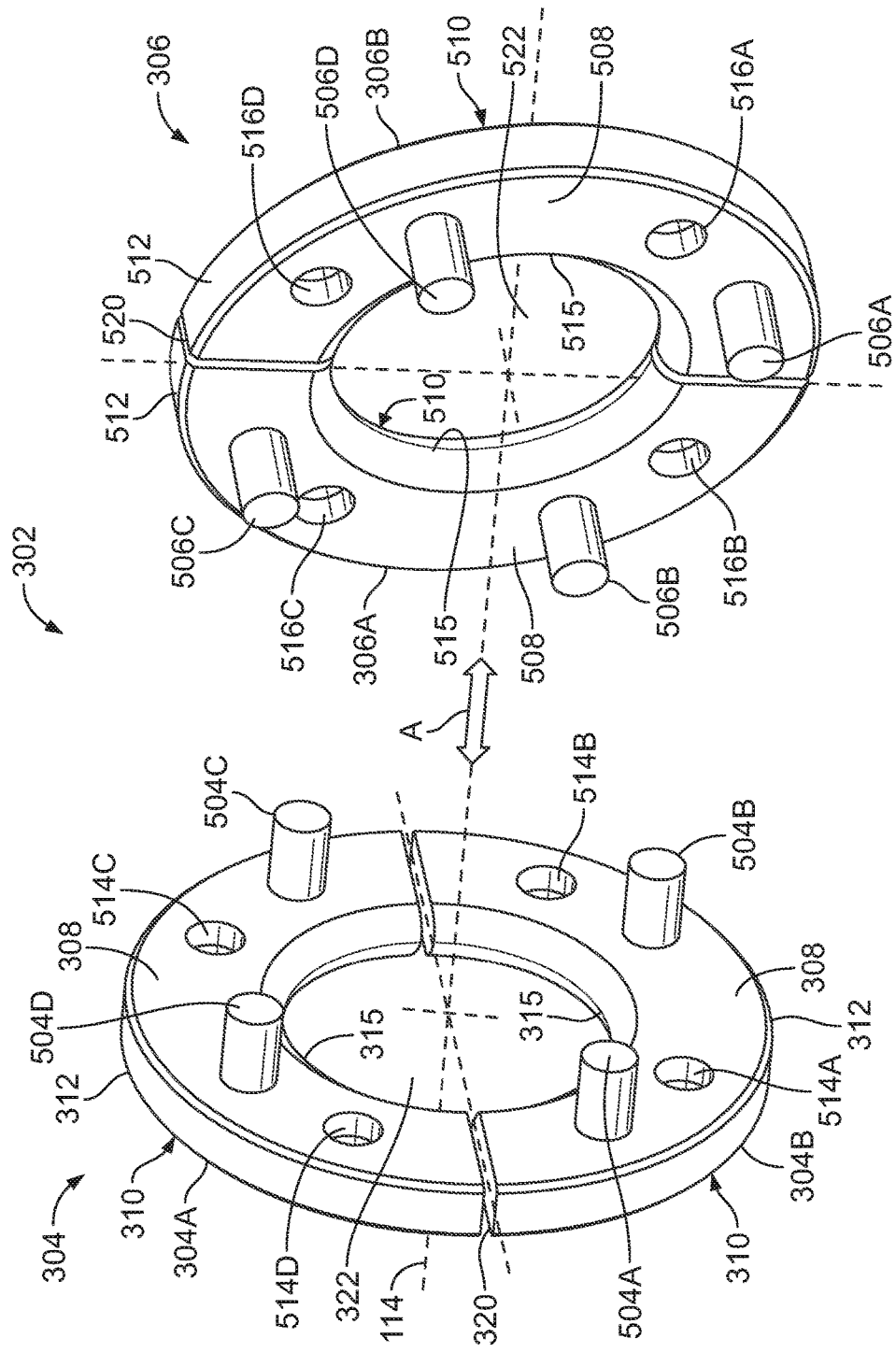
FIG. 3 is an exploded view of a clamp system formed in accordance with an embodiment.
Figure 4:
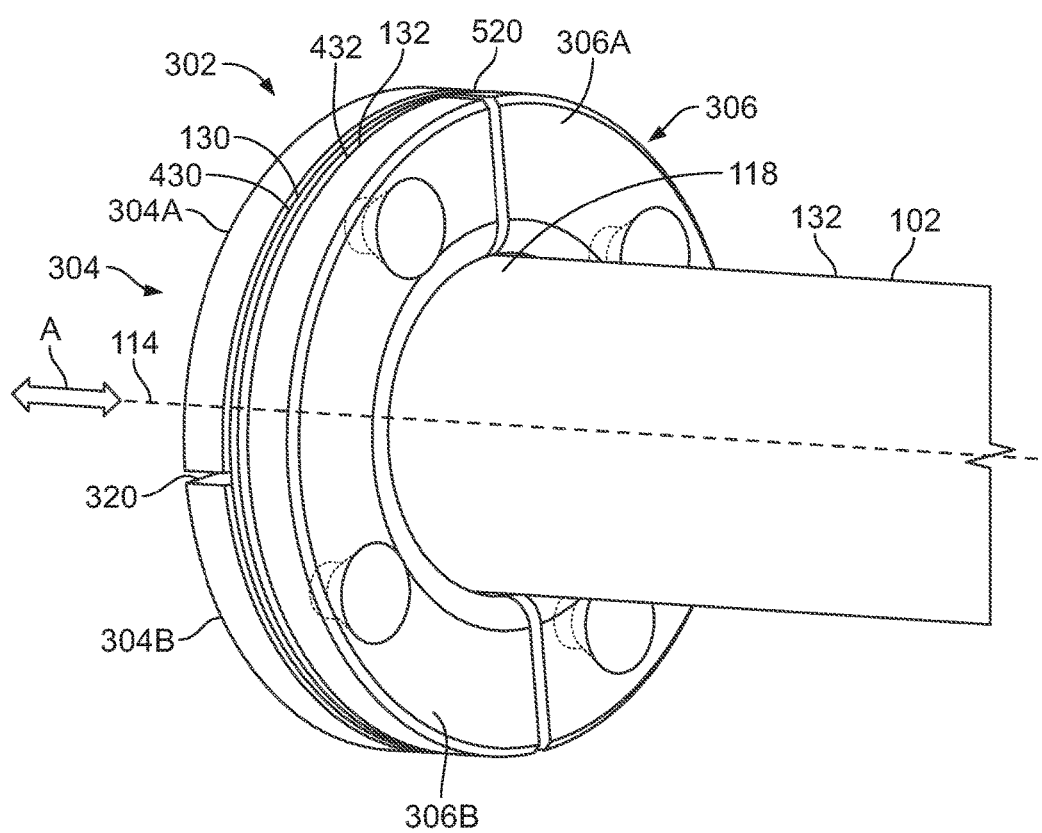
FIG. 4 is partial perspective view of the clamp system shown in FIG. 3.

FIG. 3 is a partial perspective view of a clamp system 302 formed in accordance with an embodiment. FIG. 4 is an exploded view of the clamp system 302. FIGS. 3 and 4 will be discussed together herein.

The clamp system 302 includes a front clamping member 304 that is coupled to a rear clamping member 306 in an axial direction A along the mating axis 114 of the connector assembly 103. The front and rear clamping members 304, 306 are shaped and sized in order to be disposed within the cavity 124 of the body 112 of the backshell 106 of the connector assembly 103 (illustrated in FIG. 2).

The front clamping member 304 may be inverted and substantially identical and/or hermaphroditic to the rear clamping member 306. The front clamping member 304 includes discrete clamps 304A, 304B that are inverted and substantially identical. Optionally, the front clamping member 304 may include any number of clamps that define the front clamping member 304. For example, the front clamping member 304 may be a single clamp, may include two or more identical or non-identical clamps 304, or have any alternative configuration. The discrete clamps 304A, 304B each include an inner surface or a mating surface 308 and outer surface 310. The mating surface 308 is configured to face an inner surface or a mating surface 508 of the rear clamping member 306, and the outer surface 310 is configured to face away from the rear clamping member 306 when the front and rear clamping members 304, 306 are connected.

The rear clamping member 306 includes discrete clamps 306A, 306B that are inverted and substantially identical. Optionally, the rear clamping member 306 may include any number of clamps that define the rear clamping member 306. For example, the rear clamping member 306 may be a single clamp, may include two or more identical or non-identical clamps 306, or have any alternative configuration. The discrete clamps 306A, 306B each include the mating surface 508 that is configured to face the mating surface 308 of the discrete clamps 304A, 304B, and an outer surface 510 that is configured to face away from the front clamping member 304 when the front and rear clamping members 304, 306 are connected. In the illustrated embodiment, the clamp system 302 includes four substantially identical discrete clamps 304A, 304B, 306A, 306B. Optionally, the clamp system 302 may include any number of substantially identical discrete clamps, may include any number of substantially unique discrete clamps, or any combination therein.

The front clamping member 304 and the rear clamping member 306 have substantially identical inverted semi-circular cross-sectional shapes. For example, the clamps 30A, 304B, 306A, and 306B may be manufactured out of the same mold. Additionally or alternatively, one or more of the front or rear clamping members 304, 306 may have an alternative cross-sectional shape. For example, the front clamping member 304 may have a rectangular, hexagonal, or the like, cross-sectional shape that may be unique or common to the cross-sectional shape of the rear clamping member 306.

In one or more embodiments, the front clamping member 304 may be connected to the rear clamping member 306 by crimping the front and rear clamping members 304, 306 together. For example, in the illustrated embodiment, the front clamping member 304 includes posts 504 and channels 514. The posts 504 extend a distance away from the mating surface 308 of the front clamping member 304. The channels 514 of the front clamping member 304 are passages that extend between and are open to the mating surface 308 and the outer surface 310 of the front clamping member 304. Additionally, the rear clamping member 306 includes posts 506 and channels 516. The posts 506 extend a distance away from the mating surface 508 of the rear clamping member 306. The channels 516 are passages that extend between the mating surface 508 and the outer surface 510 of the rear clamping member 306.

In the illustrated embodiment, the front clamping member 304 includes four posts 504A-D, and includes four channels 514A-D. The rear clamping member 306 includes four posts 506A-D and includes four channels 516A-D. Optionally, the front or rear clamping members 304, 306 may include any number of posts and channels. For example, the front clamping member 304 may have any number of posts (e.g., and devoid channels), and the rear clamping member may have the same number of channels (e.g., and devoid posts). The front and rear clamping members 304, 306 are connected together by coupling the posts 504, 506 with the corresponding channels 516, 514 of the front and rear clamping members 304, 306. For example, the post 504A is configured to be received into the channel 516A, the post 504B is configured to be received into the channel 516B, the post 504C is configured to be received into the channel 516C, and the post 504D is configured to be received into the channel 516D. Additionally, the post 506A is configured to be received into the channel 514A, the post 506B is configured to be received into the channel 514B, the post 506C is configured to be received into the channel 514C, and the post 506D is configured to be received into the channel 514D. After the posts 504, 506 are received through the channels 516, 514 in order to couple the front and rear clamping members 304, 306, the posts 504, 506 may be cold staked, crimped, compressed, or the like, in order to secure the posts 504, 506 to the to the other clamp 304, 306 and maintain a position of the posts 504, 506 within the channels 514, 516.

Optionally, the posts 504, 506 may include a flange (not shown) at a free end of each post that may snap into, conform to, or the like, the channels 516, 514 in order to maintain a position of the posts 504, 506 within the channels 516, 514. Optionally, a portion of a free end of the posts 504, 506 may be threaded and may threadably engage a nut in order to maintain a position of the posts 504, 506 within the channels 514, 516. Optionally, the front and rear clamping members 304, 306 may be connected together by any alternative mechanical fastener, by a cold staking operation, by welding or adhering, or the like. For example, the front and rear clamping members 304, 306 may be devoid the posts 504, 506 and may be devoid the channels, 514, 516 but may include any alternative mechanical fastening components such as, but not limited to, a slot and a mating track or mating component, a latch, fasteners, or the like. Optionally, the front and rear clamping members 304, 306 may be connected and held in a position by any alternative methods.

The clamps 304A, 304B have a seam or an intersection 320 that is offset from a seam or an intersection 520 of the rear clamps 306A, 306B when the front clamping member 304 is coupled to the rear clamping member 306. In the illustrated embodiment, the intersection 320 is offset from the intersection 520 by generally 90°. Alternatively, the intersections 320, 520 may be aligned or substantially aligned, may be offset by a distance greater than 90°, may be offset by a distance less than 90°, or the like.

In one or more embodiments, one or more of the front clamping member 304 or the rear clamping member 306 may be keyed (not shown) in order to orient the front clamping member 304 with the rear clamping member 306, in order to orient the clamp system 302 within the connector assembly 103, or the like. For example, the front and rear clamping members 304, 306 may include a keyed passage, a post, a protrusion or tab along the perimeter, an oblong or non-uniform shape, or the like, in order to maintain a position within the connector assembly 103, to orient the front clamping member 304 with the rear clamping member 306 and/or to orient the clamp system 302 in the backshell 106 during installation of the clamp system 302, or the like.

The front clamping member 304 includes an exterior surface 312 and an interior surface 315 that is substantially parallel to the exterior surface 312. Additionally, the rear clamping member 306 includes an exterior surface 512 and an interior surface 515 that is substantially parallel to the exterior surface 512. The interior surfaces 315, 515 of the front and rear clamping members 304, 306 are configured to extend around the end segment 118 of the cable 102 such that the clamp system 302 engages the end segment 118 of the cable 102. In the illustrated embodiment, the exterior and interior surfaces 312, 315, 512, 515 of the front and rear clamping members 304, 306 are concentric and extend circumferentially about the mating axis 114. Optionally, one or more of the exterior or interior surfaces 312, 315, 512, 515 may be keyed, may not be concentric, may extend only a portion of the circumference about the mating axis 114, or the like.

The front and rear clamping members 304, 306 each include a cable passage 322, 522 that is defined by the interior surfaces 315, 515 of the front and rear clamping members 304, 306. The cable passages 322, 522 receive the end segment 118 of the cable 102. For example, the cable passage 322 of the front clamping member 304 is an open passage between the mating surface 308 and the outer surface 310, and the cable passage 522 of the rear clamping member 306 is an open passage between the mating surface 508 and the outer surface 510.

A terminating end 430 of the cable shield 130 is terminated to the clamp system 302 between the front and rear clamping members 304, 306 in a direction substantially parallel to the mating axis 114. A portion of the terminating end 430 of the cable shield 130 at the end segment 118 of the cable 102 is configured to separate from the cable 102 and extend between the mating surface 308 of the front clamping member 304 and the mating surface 508 of the rear clamping member 306. The posts 504, 506 pierce through the cable shield 130 during mating of the front and rear clamping members 304, 306 to mechanically and electrically connect the cable shield 130 to the clamp system 302. Optionally, the terminating end 430 of the cable shield 130 may include the same number of shield apertures as the number of posts 504, 506 and channels, 514, 516. For example, the posts 504, 506 may extend through the shield apertures of the terminating end 430 of the cable shield 130 and through the channels 516, 514 in order to electrically and mechanically couple the cable shield 130 to the clamp system 302.

Optionally, a terminating end 432 of the protective jacket 132 may be mechanically coupled to the clamp system 302 between the cable shield 130 and the rear clamping member 306 in a direction substantially parallel to the mating axis 114. For example, a portion of the terminating end 432 of the protective jacket 132 at the end segment 118 of the cable 102 is configured to separate from the cable 102 and extend between the cable shield 130 and the mating surface 508 of the rear clamping member 306. For example, the posts 504, 506 pierce through the protective jacket 132 and the cable shield 130 during mating of the front and rear clamping members 304, 306 to mechanically couple the protective jacket 132 and mechanically and electrically couple the cable shield 130 to the clamp system 302. Optionally, the terminating end 432 of the protective jacket 132 may include a same number of jacket apertures as the number of posts 504, 506 and channels 514, 516. For example, the posts 504, 506 may extend through the shield apertures of the terminating end 430 of the cable shield 130, through the jacket apertures of the terminating end 432 of the protective jacket 132, and through the channels 516, 514 in order to mechanically couple the protective jacket 132 to the clamp system 302.

In one or more embodiments, the terminating end 430 of the cable shield 130 may be terminated to the clamp system 302 between the front and rear clamping members 304, 306, and the terminating end 432 of the protective jacket 432 may not be terminated to the clamp system 302 between the front and rear clamping members 304, 306. For example, in one embodiment, the clamp system 302 may electrically and mechanically terminate the cable shield 130 and may not mechanically couple the protective jacket 132 to the clamp system 302. Alternatively, in one embodiment, the clamp system 302 may electrically and mechanically terminate the cable shield 130 and mechanically couple the protective jacket 132 to the clamp system 302.

Figure 5:
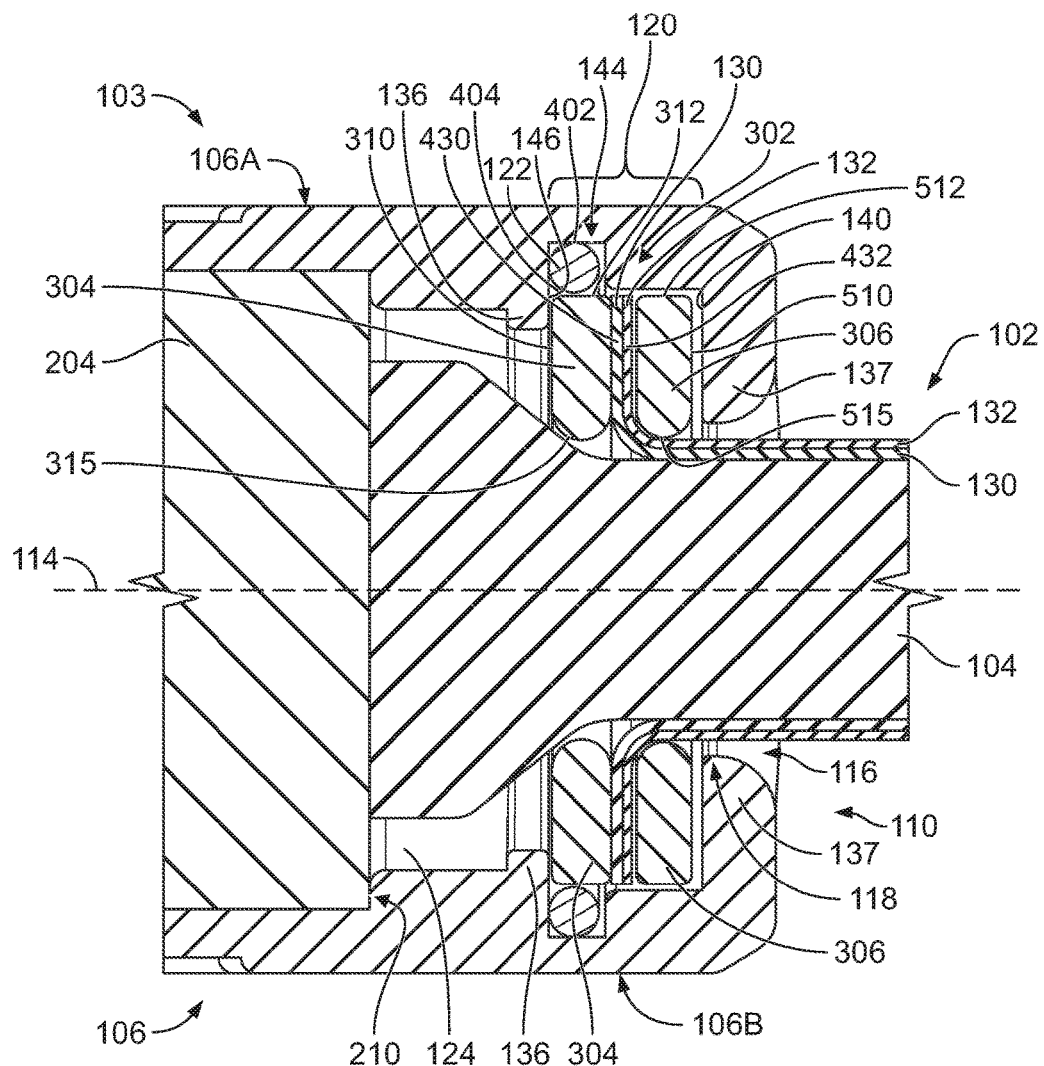
FIG. 5 is a partial cross-sectional view of a shield assembly of a connector assembly formed in accordance with an embodiment.

FIG. 5 is a partial cross-sectional view of the shield assembly 120 disposed within the connector assembly 103 and taken along A-A shown in FIG. 1, in accordance with an embodiment. The outer surface 310 of the forward clamping member 304 is disposed facing the inner surface 146 of the forward flange 136. Additionally, the outer surface 510 of the rear clamping member 306 is disposed facing the inner surface 140 of the rear flange 137. For example, the forward flange 136 and the rear flange 137 maintain a position of the clamp system 302 along the mating axis 114 within the cavity 124 of the body 112.

The EMI gasket 122 electrically terminates the clamp system 302 of the shield assembly 120 to the backshell 106 of the connector assembly 103. For example, the EMI gasket 122 extends around the mating axis 114 and is in contact with the discrete sub-shells 106A, 106B and the shield assembly 120. The EMI gasket 122 has a backshell interface 402 and a clamp interface 404. The backshell interface 402 engages with backshell 106. For example, the backshell interface 402 of the EMI gasket 122 mates with, is in contact with, is terminated to, or the like, the body 112 of the backshell 106 within the gasket channel 144. The clamp interface 404 of the EMI gasket 122 engages with the clamp system 302. For example, the clamp interface 404 of the EMI gasket 122 mates with, is in contact with, is terminated to, or the like, the exterior surface 312 of the front clamping member 304. Additionally or alternatively, the EMI gasket 122 may be shaped and sized in order to engage with the exterior surfaces 312, 512 of the front and rear clamping members 304, 306. Optionally, the EMI gasket 122 may be positioned in order to engage with the exterior surface 512 of the rear clamping member 306. For example, the gasket channel 144 may be disposed proximate to the rear clamping member 306 relative to the front clamping member 304 such that the clamping interface 404 of the EMI gasket 122 mates with the rear clamping member 306. Optionally, the clamping interface 404 may engage the clamp system 302 at any alternative surface of the clamp system 302.

The shield assembly 120 electrically terminates the cable shield 130 to the backshell 106 of the connector assembly 103. For example, the clamp system 302 of the shield assembly 120 provides an electrical pathway between the cable shield 130 and the backshell 106 of the connector assembly 103 in order to electrically terminate the cable shield 130 to the connector assembly 103. The shield assembly 120 provides effective EMI shielding for the cable 102 as the shield assembly 120 is terminated inside of the backshell 106 of the connector assembly 103.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A connector assembly for terminating a cable having a cable shield that is electrically conductive, the connector assembly comprising:
   a backshell that is electrically conductive comprising a body that extends from a mating end to a cable end along a mating axis of the connector assembly, the backshell configured to provide shielding for an electrical connector configured to be received in the backshell at the mating end, the cable end comprising a cable channel that extends through the body and is configured to hold an end segment of the cable therein;
   a shield assembly comprising a clamp system, wherein the clamp system is electrically conductive and held within the cable end of the body of the backshell, the clamp system comprising a front clamping member and a rear clamping member, the cable shield of the cable configured to terminate to the front clamping member and to the rear clamping member of the clamp system between the front clamping member and the rear clamping member; and
   an electromagnetic interference (EMI) gasket, wherein the EMI gasket is electrically coupled to the backshell and held within the cable end of the body of the backshell, the EMI gasket comprising a backshell interface and a clamp interface, wherein the backshell interface is configured to engage the backshell and the clamp interface is configured to engage an exterior surface of at least one of the front clamping member or the rear clamping member of the clamp system.

2. The connector assembly of claim 1, further comprising a protective jacket that extends around the cable shield of the cable, wherein the protective jacket is configured to terminate to the clamp system between the front clamping member and the rear clamping member.

3. The connector assembly of claim 1, wherein the clamp system is configured to extend around the end segment of the cable such that the clamp system engages the end segment of the cable.

4. The connector assembly of claim 1, wherein the front clamping member is configured to be crimped with the rear clamping member in an axial direction.

5. The connector assembly of claim 1, wherein one or more of the front clamping member or the rear clamping member includes one or more posts, and wherein one or more of the front clamping member or the rear clamping member includes one or more channels, wherein the one or more posts are configured to be inserted into the one or more channels.

6. The connector assembly of claim 5, wherein the one or more posts are configured to pierce through the cable shield to terminate the cable shield to the clamp system.

7. The connector assembly of claim 5, further comprising a protective jacket that extends around the cable shield of the cable, wherein the one or more posts are configured to pierce through the protective jacket to mechanically couple the protective jacket to the clamp system.

8. The connector assembly of claim 1, wherein the clamp system and the EMI gasket are configured to extend circumferentially around the cable.

9. The connector assembly of claim 1, the backshell further comprising one or more flanges at the cable end configured to extend into the cable channel, wherein the flanges are configured to maintain a position of the clamp system within the backshell.

10. The connector assembly of claim 1, the clamp system further comprising one or more front clamping members and one or more rear clamping members.

11. The connector assembly of claim 1, wherein the body of the backshell comprises an upper shell defining a portion of a cavity of the body, and a lower shell coupled to the upper shell and defining a portion of the cavity of the body.

12. The connector assembly of claim 11, wherein the upper shell and the lower shell are identical shells inverted and coupled together by one or more fasteners.

13. A connector assembly comprising:
    a shield assembly comprising a clamp system that is held within a cable end of a backshell of the connector assembly, the backshell configured to be electrically conductive comprising a body that extends between the cable end and a mating end along a mating axis of the connector assembly, the connector assembly configured to terminate a cable having a cable shield that is electrically conductive, the clamp system comprising a front clamping member and a rear clamping member, the cable shield of the cable configured to terminate to the front clamping member and to the rear clamping member of the clamp system between the front clamping member and the rear clamping member; and
    an electromagnetic interference (EMI) gasket that is electrically coupled to the backshell and held within the cable end of the body of the backshell and configured to extend to the mating end of the body, the EMI gasket comprising a backshell interface and a clamp interface, wherein the backshell interface is configured to engage the backshell and the clamp interface is configured to engage an exterior surface of at least one of the front clamping member or the rear clamping member of the clamp system.

14. The connector assembly of claim 13, further comprising a protective jacket that extends around the cable shield of the cable, wherein the protective jacket is configured to mechanically couple to the clamp system between the front clamping member and the rear clamping member.

15. The connector assembly of claim 13, wherein the front clamping member is configured to be crimped with the rear clamping member in an axial direction.

16. The connector assembly of claim 13, wherein one or more of the front clamping member or the rear clamping member includes one or more posts, and wherein one or more of the front clamping member or the rear clamping member includes one or more channels, wherein the one or more posts are configured to be inserted into the one or more channels.

17. The connector assembly of claim 16, wherein the one or more posts are configured to pierce through the cable shield to terminate the cable shield to the clamp system.

18. The connector assembly of claim 16, further comprising a protective jacket that extends around the cable shield of the cable, wherein the one or more posts are configured to pierce through the protective jacket to mechanically couple the protective jacket to the clamp system.

19. A connector assembly for terminating a cable having a cable shield that is electrically conductive, the connector assembly comprising:
   an electrical connector having a dielectric housing holding a plurality of contacts, the dielectric housing having a mating end configured to be mated to a mating connector along a mating axis, the dielectric housing having a cable end configured to receive one or more conductors of the cable therein;
   a backshell comprising a body that extends from a mating end to a cable end along the mating axis, the dielectric housing of the electrical connector being configured to be disposed at the mating end of the body, the cable end comprising a cable channel that extends through the body and is configured to hold an end segment of the cable therein; and
   a shield assembly comprising a clamp system, wherein the clamp system is electrically conductive and held within the cable end of the body of the backshell, the clamp system comprising a front clamping member and a rear clamping member, the cable shield of the cable configured to terminate to the clamp system between the front clamping member and the rear clamping member, wherein one or more of the front clamping member or the rear clamping member includes one or more posts, and wherein one or more of the front clamping member or the rear clamping member includes one or more channels, wherein the one or more posts are configured to be inserted into the one or more channels; and
   an electromagnetic interference (EMI) gasket, wherein the EMI gasket is electrically coupled to the backshell and held within the cable end of the body of the backshell and configured to extend to the mating end of the body, the EMI gasket comprising a backshell interface and a clamp interface, wherein the backshell interface is configured to engage the backshell and the clamp interface is configured to engage the clamp system.

20. The connector assembly of claim 19, further comprising a protective jacket that extends around the cable shield of the cable, wherein the protective jacket is configured to mechanically couple to the clamp system between the front clamping member and the rear clamping member.

\* \* \* \* \*